United States Patent

[11] 3,588,550

[72] Inventor Toshiyuki Matsuda
Tokyo, Japan
[21] Appl. No. 755,600
[22] Filed Aug. 27, 1968
[45] Patented June 28, 1971
[73] Assignee Honeywell Inc.
Minneapolis, Minn.
[32] Priority Aug. 30, 1967
[33] Japan
[31] 42/55194

[54] A COMPOSITE TRANSISTOR CIRCUIT HAVING A CONTROLLABLE VBE
1 Claim, 5 Drawing Figs.

[52] U.S. Cl. .......... 307/313, 307/296
[51] Int. Cl. .......... H03k 1/00
[50] Field of Search .......... 307/296, 303, 313, 270; 330/13, 40, 17

[56] References Cited
UNITED STATES PATENTS
3,484,708 12/1969 Illingworth .......... 330/17X
FOREIGN PATENTS
236,979 9/1960 Australia .......... 307/296

*Primary Examiner*—Roy Lake
*Assistant Examiner*—James B. Mullins
*Attorneys*—Arthur H. Swanson and Lockwood D. Burton

ABSTRACT: A composite transistor circuit comprising two or more transistors is used in a current converting circuit. The voltages between the bases and the emitters of the transistors can be simply controlled.

INVENTOR
TOSHIYUKI MATSUDA
BY Arthur H. Swanson
ATTORNEY

A COMPOSITE TRANSISTOR CIRCUIT HAVING A CONTROLLABLE VBE

BACKGROUND OF THE INVENTION

This invention relates to a composite transistor circuit comprising two or more transistors.

In recent years, low DC power source voltages, such as 24 volts, have been increasingly used for industrial measuring instrument. With such low power source voltages, the voltage available at a current converting circuit or a load is limited to only a very low level, and as a result of it, some of the conventionally unimportant problems, such as the dispersion of voltage between base and emitter of each transistor and temperature compensation thereof, have become serious factors for successful measurement.

SUMMARY OF THE INVENTION

In this invention, an adjustable resistance is inserted in series with one of a transistor of the composite transistor. The voltages between the bases and the emitters of the transistors of the composite transistor can be controlled by adjusting the resistance.

Therefore, an object of the present invention is to provide a composite transistor circuit, usable in current converting circuits and the like, which is actuated by a low power source voltage and has an easily controllable base-emitter voltage V*be*.

DESCRIPTION OF THE PREFERRED EMBODIMENTS

Figure 1:
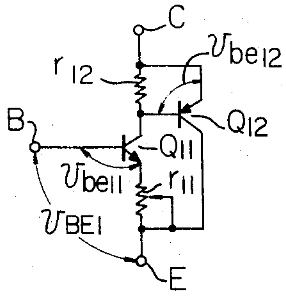
FIGS. 1 and 2 are circuit diagrams illustrating fundamental connections of composite transistor circuits, according to the present invention.

In FIG. 1, a composite transistor circuit comprises a first transistor $Q_{11}$ of NPN type and a second transistor $Q_{12}$ of the opposite PNP polarity. A base B, an emitter E, and a collector C of this composite transistor circuit are connected to a base of the first transistor $Q_{11}$, a collector of the second transistor $Q_{12}$, and an emitter of the second transistor $Q_{12}$, respectively. An adjustable low resistance $r_{11}$ is inserted between an emitter of the first transistor $Q_{11}$ and the collector of the second transistor $Q_{12}$, while a high resistance $r_{12}$ is inserted between a collector of the first transistor $Q_{11}$ and the emitter of the second transistor $Q_{12}$. The resistance $r_{11}$ is far smaller than the resistance $r_{12}$, i.e., $r_{11} << _{12}$. The collector of the first transistor $Q_{11}$ is directly connected to the base of the second transistor $Q_{12}$.

Let it be assumed that various voltages and currents at different points of the two transistors are represented by the following symbols.

V*be*11: base-emitter voltage of $Q_{11}$
V*be*12: base-emitter voltage of $Q_{12}$
VBE1: base-emitter voltage of the composite transistor circuit
I: current through $r_{11}$
Ic11: collector current of $Q_{11}$
IB12: 10 base current of $Q_{12}$ Then, the following relation should be satisfied.

$$Ic11=(Vbe12/r12)+IB12$$

In view of the fact that $(Vbe12/r12) << IB$, $$Ic11=(Vbe12/r12).$$

Accordingly, the following equation can be derived.

$$VBE1 = Vbe11 + Ir11$$
$$= Vbe11 + Ic11r11$$
$$= Vbe11 + (r11/r12)Vbe12$$

Thus, by adjusting the resistance $r_{11}$, the base-emitter voltage VBE1 of the composite transistor circuit can be controlled.

Figure 2:
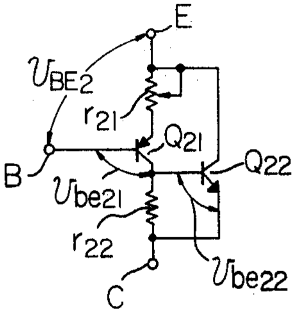

FIG. 2 shows another composite transistor circuit, which comprises a first transistor $Q_{21}$ of PNP type, and a second transistor $Q_{22}$ of the opposite NPN polarity. A base B, an emitter E, and a collector C of this composite transistor circuit are connected to a base of the first transistor $Q_{21}$, a collector of the second transistor $Q_{22}$, and an emitter of the second transistor $Q_{22}$, respectively. A variable low resistance $r_{21}$ is inserted between an emitter of the first transistor $Q_{21}$ and the collector of the second transistor $Q_{22}$, while a high resistance $r_{22}$ is inserted between a collector of the first transistor $Q_{21}$ and the emitter of the second transistor $Q_{22}$. The resistance $r_{21}$ is far smaller than the resistance $r_{22}$, i.e. $r_{21} << r_{22}$. The collector of the first transistor $Q_{21}$ is directly connected to the base of the second transistor $Q_{22}$.

Let it be assumed that voltages at various elements of the composite transistor circuit of FIG. 2 are designated by the following symbols.

V*be*21: base-emitter voltage of $Q_{21}$
V*be*22: base-emitter voltage of $Q_{22}$
V*be*2: base-emitter voltage of the composite transistor circuit Then, the following equation can be derived by the same procedure as the circuit of FIG. 1.

$$VBE2 = Vbe21 + Vbe22(r21/r22)$$

Accordingly, the base-emitter voltage VBE2 of the composite transistor circuit of FIG. 2 can be also controlled by adjusting the resistance *r*21.

Figure 3:
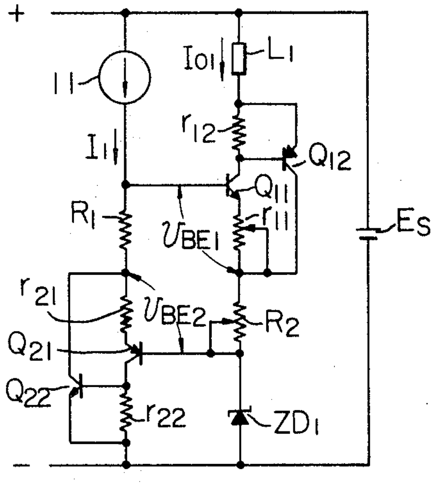
FIGS. 3 and 4 are circuit diagrams showing two embodiments utilizing the composite transistor circuits of FIGS. 1 and 2, respectively.

FIG. 3 shows a current converting circuit using composite transistor circuits, according to the present invention. In the FIG., the composite transistor circuits of FIGS. 1 and 2 are connected to a constant current circuit 11, converting resistors $R_1$ and $R_2$, a load $L_1$, a power source $E_S$, and a Zener diode $ZD_1$. If it is assumed that the current through the constant current circuit 11 and the output or load current are represented by $I_1$ and $I_{01}$, respectively, there is the following relation between base-emitter voltage VBE1 and VBE2 of the composite transistor circuits, as connected in FIG. 3.

$$R_1I_1VBE2 = R_2I_{01} + VBE1$$

Then, if VBE2 = VBE1, the above equation can be rewritten as follows.

$$R_1I_1 = R_2I_{01}$$

Therefore, the output current $I_{01}$ assumes a value corresponding to that of the current $I_1$ through the constant current circuit.

The fact that the condition of VBE2 = VBE1 is satisfied can be explained in the following way. By using the same symbols as used in the description of the circuits of FIGS. 1 and 2, the following relations can be easily derived for the circuit of FIG. 3.

$$Vbe11 - Vbe21 = (r21/r22)Vbe22 - (r11/r12)Vbe12$$

The left-hand side of the last mentioned equation represents the dispersion of base-emitter voltage of the transistors, while its right-hand side shows that the above dispersion can be compensated for by adjusting the resistors $r_{11}$ and $r_{21}$. In other words, even when there is a difference between the two base-emitter voltages V*be*11 and V*be*21, the dispersion in the base-emitter voltage can be compensated for by using the resistor $r_{11}$ or $r_{21}$.

By rearranging the last mentioned equation, $$Vbe11 + (r_{11}/r_{12})Vbe12 = Vbe21 + (r_{21}/r_{22})Vbe22.$$

Thus, it is possible to achieve the condition of VBE1 = VBE2 by adjusting the resistor $r_{11}$ or $r_{21}$.

The base-emitter voltages V*be*12 and V*be*22 affect the collector current $Ic_{11}$ of the transistor $Q_{11}$ and the collector current $Ic_{21}$ of the transistor $Q_{21}$, in the manner as shown by the following equations.

$$\delta Ic_{11} = Ic_{11}(\delta Vbe12/Vbe12) = \delta Vbe12/r_{12}$$
$$\delta Ic = Ic_{21}(\delta Vbe22/Vbe22) = \delta Vbe22/r_{22}$$

As described above, there are following relations among resistance values of various resistors; namely, $r_{12}=r_{22}$, $r_{12} << r_{11}$, and $r_{22} \gg r_{21}$. Generally speaking, $Vbe_{12} \doteq Vbe_{22}$ and $\delta Vbe_{12} \doteq Vbe_{22}$. Accordingly, both $\delta Ic_{11}$ and $\delta Ic_{21}$ are small, and the effects of $Vbe_{12}$ and $Vbe_{22}$ on $Ic_{11}$ and $Ic_{21}$ are very small and such effects are caused in mutually cancelling directions. Therefore, such effects can be neglected.

Figure 4:
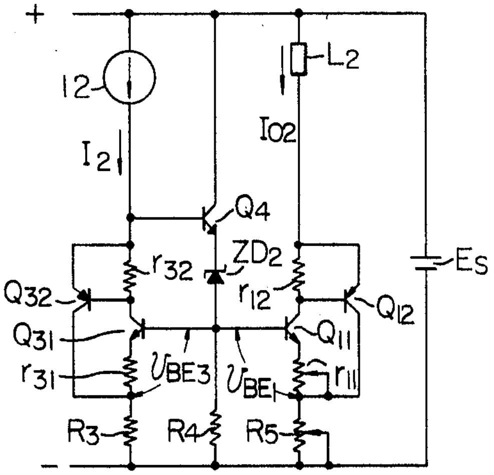

FIG. 4 shows another current converting circuit incorporating the composite transistor circuits according to the present invention. It is apparent that the dispersion in the base-emitter voltage of this current converting circuit can be also compensated for, based on the same principles as the circuit of FIG. 3.

Figure 5:
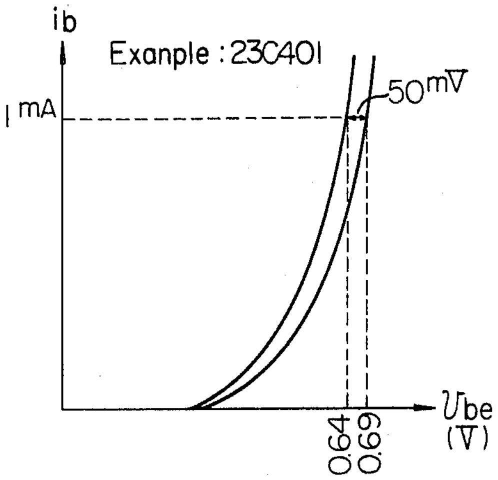
FIG. 5 is a graph illustrating the base-emitter voltage characteristics of a transistor.

FIG. 5 shows the base-emitter voltage dispersion characteristics, which can be controlled in the aforesaid manner, with the base current $i_b$ plotted on the ordinate and the base-emitter voltage $Vbe$ on the abscissa.

As described in the foregoing, according to the present invention, the base-emitter voltage of a composite transistor circuit can be controlled by using a simple circuit construction incorporating a combination of composite transistor circuits, and zero adjustment (VBE1 =VBE2) of a current converting circuit including a pair of transistors of opposite polarities can be accomplished, by using the composite transistor circuits according to the present invention.

Moreover, it is a well known fact that when two transistors having the same base-emitter voltage are driven at a certain level, the temperature coefficient of the $Vbe$ thereof becomes in good agreement between each other (for instance, A. H. Hoffait and R. D. Thornton, "Limitation of Transistor DC Amplifier," Proceedings of IEEE, Feb. 1964 pp. 179—184). Therefore, if the composite transistor circuits are used in current converting circuits such as those illustrated in FIGS. 3 and 4, such current converting circuits have an advantage in that its temperature characteristics is improved.

I claim:

1. A composite transistor circuit including a pair of transistors of opposite polarities, characterized by comprising a variable resistor inserted between an emitter of one transistor of said pair of transistors and an equivalent-emitter terminal of said composite transistor circuit, and a fixed value resistor inserted between a collector of said one transistor and an equivalent-collector terminal of said composite transistor circuit, said fixed value resistor being large with respect to the value of the resistance of said variable resistor, said one transistor having a base connected to an equivalent-base terminal of said composite transistor circuit, the other transistor of said pair of transistors having an emitter, a collector, and a base respectively connected to said equivalent-collector terminal of said composite transistor circuit, said equivalent-emitter terminal of said composite transistor circuit, and said collector of said one transistor, whereby a voltage between said equivalent-base terminal and said equivalent-emitter terminal of said composite transistor circuit is controlled by adjusting said variable resistor.